United States Patent
Asami et al.

(10) Patent No.: US 8,263,871 B2
(45) Date of Patent: Sep. 11, 2012

(54) MOUNT BOARD AND SEMICONDUCTOR MODULE

(75) Inventors: Hiroshi Asami, Shizuoka (JP); Osamu Yamagata, Kanagawa (JP)

(73) Assignee: Sony Corporation, Tokyo (JP)

( * ) Notice: Subject to any disclaimer, the term of this patent is extended or adjusted under 35 U.S.C. 154(b) by 269 days.

(21) Appl. No.: 12/620,216

(22) Filed: Nov. 17, 2009

(65) Prior Publication Data

US 2010/0122838 A1  May 20, 2010

(30) Foreign Application Priority Data

Nov. 19, 2008 (JP) ................................. 2008-295195

(51) Int. Cl.
*H05K 1/00* (2006.01)
*H01L 23/34* (2006.01)

(52) U.S. Cl. .................... 174/252; 174/260; 257/713

(58) Field of Classification Search .......... 174/250–268; 361/728–804; 257/706, 712–714, 717, 720–722
See application file for complete search history.

(56) References Cited

U.S. PATENT DOCUMENTS

| | | | |
|---|---|---|---|
| 5,136,471 A * | 8/1992 | Inasaka | 361/794 |
| 5,451,721 A | 9/1995 | Tsukada et al. | |
| 5,459,368 A * | 10/1995 | Onishi et al. | 310/313 R |
| 6,351,194 B2 * | 2/2002 | Takahashi et al. | 333/133 |
| 7,315,083 B2 * | 1/2008 | Igarashi et al. | 257/758 |
| 7,886,438 B2 * | 2/2011 | Ito et al. | 29/852 |
| 2005/0057906 A1 * | 3/2005 | Nakatani et al. | 361/771 |
| 2006/0180344 A1 * | 8/2006 | Ito et al. | 174/262 |

FOREIGN PATENT DOCUMENTS

| | | |
|---|---|---|
| JP | 61-124196 | 6/1986 |
| JP | 02-101794 | 4/1990 |
| JP | 06-013529 | 1/1994 |
| JP | 07-176873 | 7/1995 |
| JP | 2739726 | 1/1998 |
| JP | 11-317582 | 11/1999 |
| JP | 2000-156564 | 6/2000 |
| JP | 2001-111237 | 4/2001 |
| JP | 2001-135789 | 5/2001 |
| JP | 2003-101243 | 4/2003 |
| JP | 2003-298234 | 10/2003 |
| JP | 2005-064357 | 3/2005 |

OTHER PUBLICATIONS

Japanese Patent Office Action corresponding to Japanese Serial No. JP2008-295195 dated Jul. 20, 2010.

* cited by examiner

*Primary Examiner* — Zachary M Pape
(74) *Attorney, Agent, or Firm* — SNR Denton US LLP

(57) ABSTRACT

A mount board includes a laminated wiring section including a plurality of wiring layers formed on a surface of a substrate in a laminated manner, wherein a portion of an inner wiring layer is exposed to the outside, the inner wiring layer being any of the plurality of wiring layers excluding an uppermost wiring layer.

7 Claims, 4 Drawing Sheets

FIG. 1
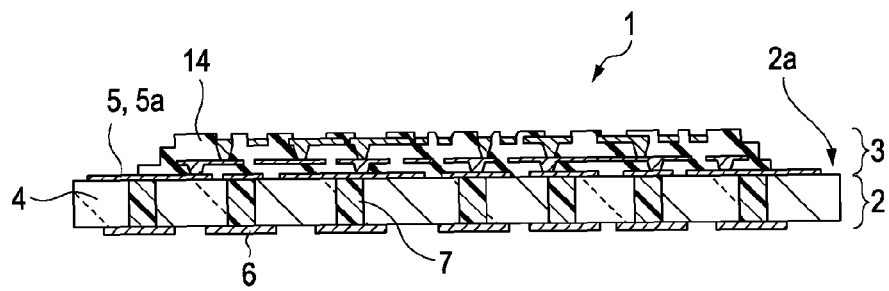
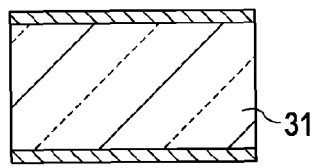
FIG. 2A
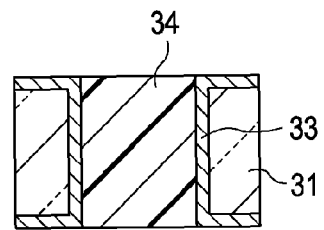
FIG. 2D
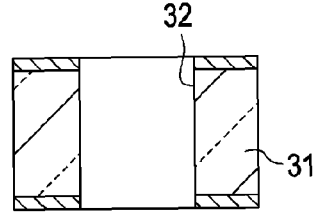
FIG. 2B
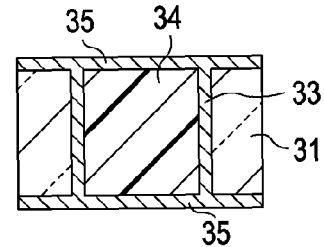
FIG. 2E
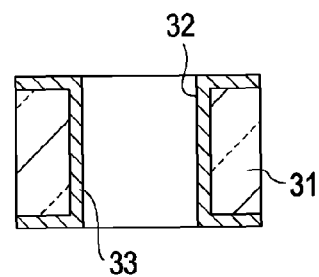
FIG. 2C
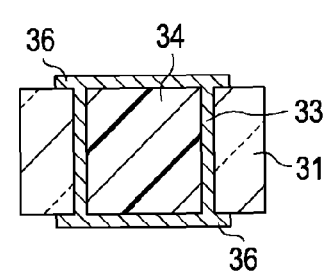
FIG. 2F

MOUNT BOARD AND SEMICONDUCTOR MODULE

BACKGROUND OF THE INVENTION

1. Field of the Invention

The present invention relates to a mount board for mounting electronic components thereon, and to a semiconductor module including the mount board.

2. Description of the Related Art

In recent years, high density and low thermal resistance have been demanded for mount boards that are used for mounting electronic components including semiconductor chips such as large scale integration (LSI) chips thereon. High density is demanded because the pin counts of LSI chips have increased and the use of multichip modules that include a plurality of semiconductor chips has become widespread. Low thermal resistance is demanded because the power consumption of LSI chips has increased and because of factors related to end products.

In general, a mount board for a multichip module has to have a set of electrode terminals for each of the semiconductor chips in the multichip module. Thus, wiring on a side on which the semiconductor chips are mounted has been multi-layered. Therefore, a multilayer wiring board called a build-up board is used as a mount board (see, for example, Japanese Patent No. 2739726). In general, a build-up substrate includes a core board and wiring layers laminated symmetrically on the upper and lower surfaces of the core board.

A semiconductor chip, such as an LSI chip, or a semiconductor package including a semiconductor chip sealed therein are mounted on a mount board such that the semiconductor chip or the semiconductor package is electrically and mechanically connected to the uppermost wiring layer through, for example, bumps. Japanese Unexamined Patent Application Publication No. 07-176873 discloses a technique in which a semiconductor chip is fixed to a bonding pad using a die bonding member and electrically connected to the uppermost wiring layer by wire bonding. In addition, Japanese Unexamined Patent Application Publication No. 07-176873 discloses a technique in which heat generated by a semiconductor chip is radiated to the atmosphere through the uppermost wiring layer of build-up layers.

When semiconductor devices such as semiconductor chips and semiconductor packages are mounted on the uppermost layer of build-up wiring layers, a part of heat generated by the semiconductor chips and the semiconductor packages is transferred through the uppermost layer to inner wiring layers (under layers) connected to the uppermost layer.

SUMMARY OF THE INVENTION

However, each of the wiring layers formed on a side on which semiconductor devices are mounted is covered with a resin insulating layer having a high thermal resistance. Moreover, if the uppermost wiring layer is used for heat radiation, the area available for mounting electronic components is limited. Therefore, a demand for high density and a demand for low thermal resistance have not been simultaneously satisfied.

It is desirable to provide a technique with which a demand for high density and a demand for low thermal resistance when mounting electronic components are simultaneously satisfied.

According to an embodiment of the present invention, there is provided a mount board including a laminated wiring section including a plurality of wiring layers formed on a surface of a substrate in a laminated manner, wherein a portion of an inner wiring layer is exposed to the outside, the inner wiring layer being any of the plurality of wiring layers excluding an uppermost wiring layer.

With the mount board, a cooling structure can be mounted on the mount board using the portion of the inner wiring layer exposed to the outside. The cooling structure serves to reduce the thermal resistance of a heat transfer path through the wiring layer.

According to the embodiment, a cooling structure can be mounted on the mount board using the portion of the inner wiring layer exposed to the outside. Thus, the thermal resistance of a heat transfer path through the wiring layer can be reduced without limiting the area for mounting electronic components. Therefore, regarding mounting of electronic components, a demand for high density and a demand for low thermal resistance can be simultaneously satisfied.

BRIEF DESCRIPTION OF THE DRAWINGS

FIG. 1 is a sectional view of a mount board according to an embodiment of the present invention;

FIGS. 2A to 2F illustrate a method of making a core board;

DESCRIPTION OF THE PREFERRED EMBODIMENTS

Figure 3A:
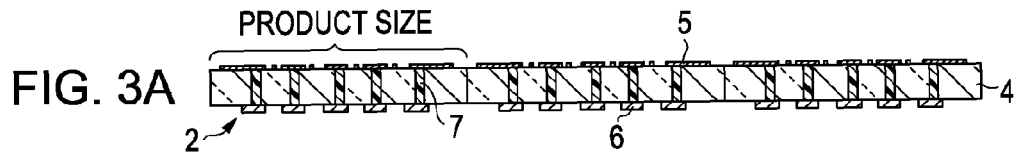
FIGS. 3A to 3H are schematic views illustrating a method of making the mount board according to the embodiment of the present invention.

Hereinafter, embodiments of the present invention are described with reference to the drawings. The technical scope of the present invention is not limited to the embodiments described below and includes various modifications and combinations as long as specific advantages can be gained by using elements of the invention and combinations thereof.

EMBODIMENTS

Structure of Mount Board

FIG. 1 is a sectional view of a mount board according to an embodiment of the present invention. A mount board 1 includes a core board 2 and a laminated wiring section 3. The core board 2 includes, for example, a substrate 4 having a plate-like shape, wiring layers 5 and 6 formed on upper and lower surfaces of the substrate 4, and feed-through conductors 7 electrically connecting the wiring layers 5 and 6 to each other. The substrate 4 is made of, for example, a rigid material such as glass epoxy. The wiring layers 5 and 6 are made of, for example, a wiring material such as copper. Each of the feed-through conductors 7 includes an electroconductive film formed on a side wall of a through hole extending through the substrate 4, the through hole being filled with resin.

The core board 2 is made by, for example, the following method. As shown in FIG. 2A, a double-sided copper clad laminate 31, which includes a substrate such as a glass epoxy substrate, is prepared. As shown in FIG. 2B, the double-sided copper clad laminate 31 is drilled so as to form a through hole 32 therein. As shown in FIG. 2C, the side wall of the through hole 32 of the double-sided copper clad laminate 31 is electroplated with copper so as to form an electroconductive film 33 thereon.

As shown in FIG. 2D, the through hole 32 coated with the electroconductive film 33 is filled with resin 34. As shown in FIG. 2E, end surfaces of the resin 34 are electroplated with copper so as to form electroconductive films 35 thereon. As shown in FIG. 2F, surfaces of the double-sided copper clad laminate 31 are etched so as to form a wiring pattern 36 of copper thereon. After these steps, the core board 2 is obtained.

The laminated wiring section 3 includes a plurality of wiring layers (including the wiring layer 5) sandwiching insulating layers 14 therebetween. The laminated wiring section 3 is formed on the core board 2 as independent islands. As a result, in the outermost periphery of the core board 2, an area in which wiring layers and insulating layers of the laminated wiring section 3 are not present, that is, an area 2a at which a surface (upper surface) of the substrate 4 is exposed to the outside is formed. Edge portions of the insulating layers 14 sandwiched by the wiring layers form a stepped shape that gradually widens from the upper side (the side away from the core board 2) to the lower side (the side close to the core board 2). The wiring layer 5 is disposed at the bottom of the stepped shape (as the lowermost layer) such that a portion 5a (edge portion) of the wiring layer 5 is exposed to the outside. The wiring layer 5 is an inner wiring layer, which is one of the wiring layers excluding the uppermost wiring layer. The term "inner wiring layer" refers not only to the wiring layer 5, which is the lowermost layer, but also to any layer of the laminated wiring section 3 that is disposed below the uppermost layer. It is preferable that the wiring layer 5 having a portion exposed to the outside be a wiring layer for ground.

Method of Making Mount Board

FIGS. 3A to 3H are schematic views illustrating a method of making the mount board according to the embodiment of the present invention. As shown in FIG. 3A, the core board 2 including the substrate 4 and the wiring layers 5 and 6 is prepared. At this stage, the core board 2 is a large substrate including individual pieces of core boards integrated with each other and arranged in a plane. The individual pieces are to be cut into the size of final products. In FIGS. 3A to 3H, for convenience of illustration, the core board 2 includes a unit of three core boards, which are to be cut into individual pieces.

Figure 3B:
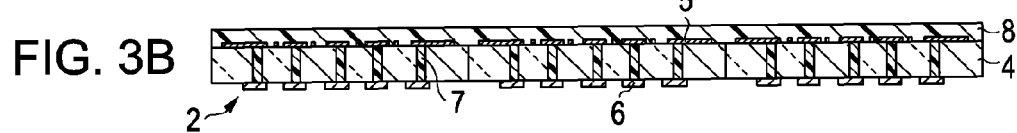

As shown in FIG. 3B, when the core board 2 is prepared, a resin layer 8 made of photosensitive resin is formed on a surface of the core board 2. The resin layer 8 serves as an insulating layer between wiring layers when the wiring layers are formed as described above. The resin layer 8 is formed by, for example, applying a negative photosensitive resin film.

Figure 3C:
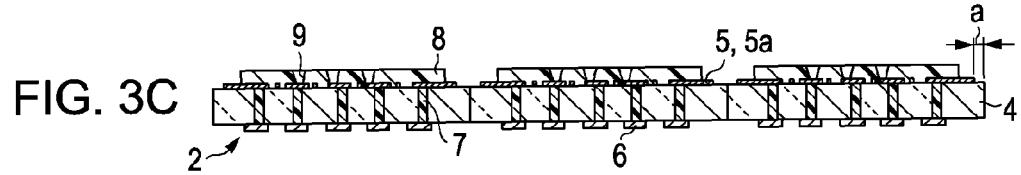

As shown in FIG. 3C, the resin layer 8 is exposed and developed, so that the resin layer 8 is divided (separated) into islands on the core board 2 and a plurality of via holes 9 are formed in the resin layer 8 of each of the islands. At this time, the portion 5a (edge portion) of the wiring layer 5, which is the lowermost layer of the inner wiring layers, is exposed to the outside, the portion 5a being outside the edge portion of the resin layer 8 that has been separated into islands. The portion 5a of the wiring layer 5 extends to the position that is, for example, a=200 μm from a product outline. The portion 5a of the wiring layer 5 is exposed to the outside by the length of, for example, b=0.5 mm.

When the resin layer 8 is divided into independent islands, physical connection (continuity) of the resin layer 8 is broken at borders (cutting lines) between individual pieces of the core boards that are adjacent to each other in a plane of the board. Thus, the stress due to heat shrinkage of the resin layer 8 is dispersed over the entire board. As a result, warping of the core board 2 due to heat shrinkage of the resin layer 8 is suppressed.

Figure 3D:
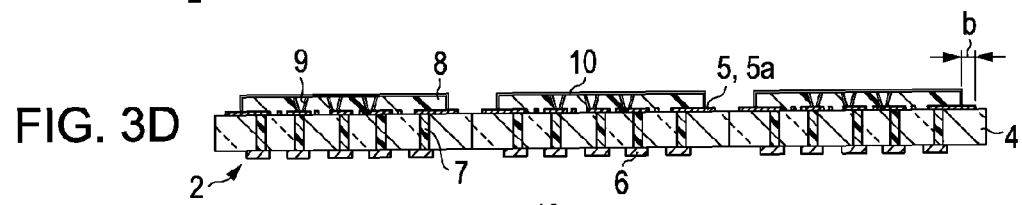

As shown in FIG. 3D, a surface of the resin layer 8 is roughened. The surface of the resin layer 8 is roughened so that the surface may have an average roughness Ra=0.5 μm by using, for example, a permanganic acid solution. Subsequently, a primary plating layer 10 (copper seed layer) is deposited to a thickness of, for example, 0.5 μm by chemical plating of copper.

Figure 3E:
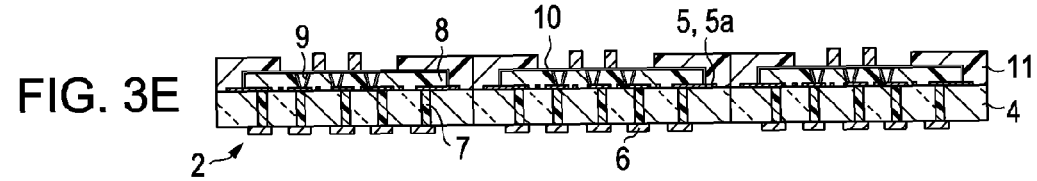

As shown in FIG. 3E, a resist film is formed on a surface of the core board 2 so as to cover the islands of the resin layer 8. Subsequently, the resist film is patterned by being exposed and developed, so that a plating resist 11 is formed.

Figure 3F:
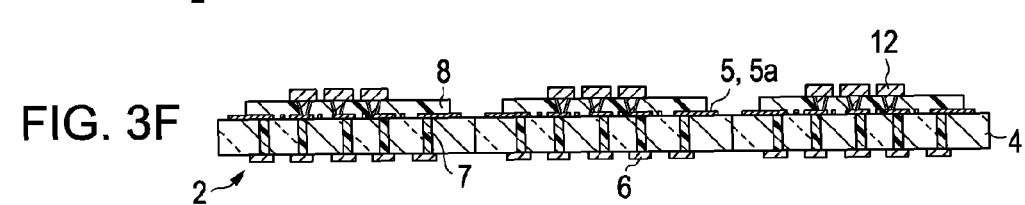

As shown in FIG. 3F, parts of a surface of the resin layer 8 that are not covered with the plating resist 11 are electroplated with copper so as to form a wiring pattern 12 having a thickness of, for example, 15 μm. The wiring pattern 12 provides a wiring layer right above the lowermost wiring layer 5. Subsequently, the plating resist 11 and the primary plating layer 10 are removed.

Figure 3G:
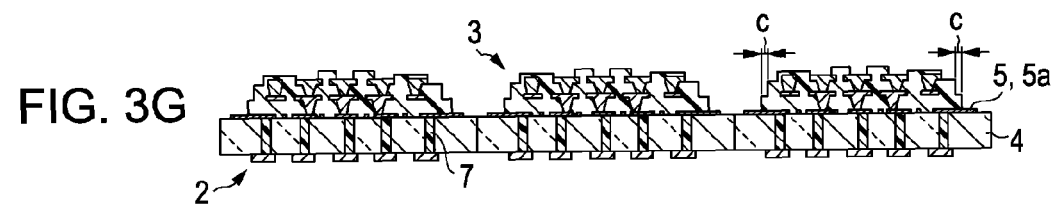

As shown in FIG. 3G, by repeating the steps of FIGS. 3B to 3F, a wiring board having a build-up structure (build-up board) including the core board 2 and the laminated wiring section 3 formed on the core board 2 is obtained. The laminated wiring section 3 is formed as islands each including wiring layers. The areas of the resin layers 8 disposed between the wiring layers decrease stepwise every time a wiring layer is stacked on the core board 2, so that edge portions of insulating layers form a stepped shape. The areas of the resin layers 8 decrease in such a manner that, for every layer, the length of the resin layer 8 in directions parallel to the surface of the substrate (horizontal directions of FIG. 3G) is reduced by, for example, c=200 μm from both ends.

Figure 3H:
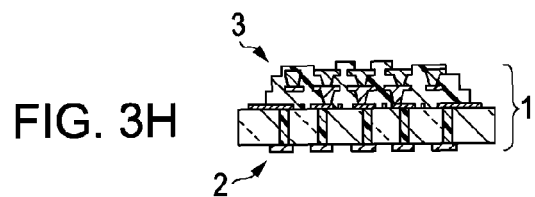

As shown in FIG. 3H, the core board 2 is cut into individual pieces by dicing and routing the core board 2 for each island of the laminated wiring section 3. Thus, the mount board 1 is obtained. The mount board 1 includes the laminated wiring section 3, which includes the wiring layers, formed on a surface of the core board 2. The portion 5a of the wiring layer 5, which is an inner layer, is exposed to the outside. In the mount board 1, the number of wiring layers formed on the upper surface of the core board 2 is different from the number of wiring layers formed on the lower surface of the core board 2. To be specific, the number of wiring layers formed on the upper surface of the core board 2 is larger than the number of wiring layers formed on the lower surface of the core board 2. Therefore, the wiring layers are laminated asymmetrically in the vertical direction with respect to the core board 2.

Structure of Semiconductor Module

Figure 4:
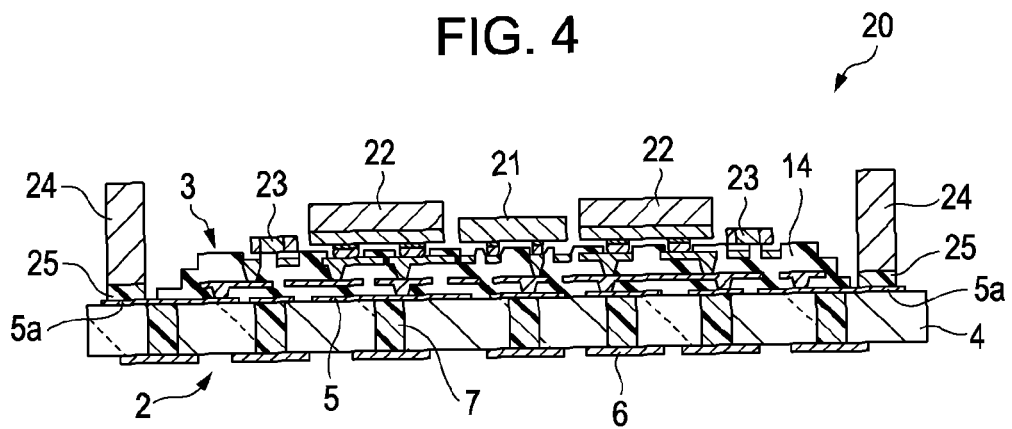
FIG. 4 is a sectional view of a semiconductor module according to an embodiment of the present invention.

FIG. 4 is a sectional view of a semiconductor module according to an embodiment of the present invention. A semiconductor module 20 includes the mount board 1 and semiconductor devices mounted on the mount board 1. As the semiconductor devices, a semiconductor chip 21 and semiconductor packages 22 are mounted. The semiconductor chip 21, the semiconductor packages 22, and chip components 23 are mounted on wiring layers formed on a surface of the mount board 1.

The semiconductor chip 21 is mounted as a bare chip by a flip chip method. The semiconductor chip 21 is electrically and mechanically connected to the uppermost layer of the wiring layers formed on the mount board 1. Each of the semiconductor packages 22 is, for example, a ball grid array (BGA) package including a semiconductor chip (for example, a memory LSI chip, not shown) sealed with resin. As with the semiconductor chip 21, the semiconductor packages 22 are electrically and mechanically connected to the uppermost wiring layer through external connection terminals such as solder balls. The semiconductor packages 22 are disposed adjacent to the semiconductor chip 21 on the surface of the mount board 1. The chip components 23 are, for example, passive components such as chip capacitors. As with the semiconductor chip 21 and the semiconductor packages 22, the chip components 23 are electrically and mechanically connected to the uppermost wiring layer.

Two cooling fins 24, which are examples of a cooling structure, are mounted on the mount board 1. The cooling fins 24 are attached to the portions 5a of the lowermost wiring layer 5, which are exposed to the outside as described above, through, for example, adhesive layers 25 made of a thermally conductive adhesive. Thus, the cooling fins 24 are mounted on the mount board 1 and thermally connected to the portions 5a of the wiring layer 5. As the thermally conductive adhesive, an adhesive made of an organic material such as epoxy resin in which inorganic filler of silica, metal powder, ceramic powder, or the like is dispersed can be used.

As the cooling fins 24, structures made of copper, which is a metal having a high thermal conductivity, having surfaces plated with nickel can be used. The cooling fins 24 include comb-like fin portions arranged in the depth direction of FIG. 4. The cooling fins 24 are mounted on the mount board 1 such that the islands of the wiring layers are interposed between the cooling fins 24. The cooling fins 24 face each other with the islands of the wiring layers therebetween.

The cooling structure is not limited to the cooling fins 24 and may be, for example, a heat sink. In addition to the cooling structure such as the cooling fins 24, electronic components (not shown) can be mounted on the mount board 1 using the portions 5a of the inner wiring layer 5 exposed to the outside.

Method of Making Semiconductor Module

Figure 5:
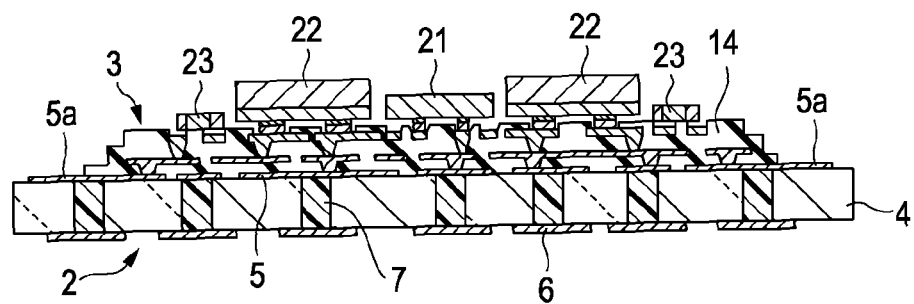
FIG. 5 is a sectional view illustrating a method of making the semiconductor module according to the embodiment of the present invention.
Figure 6:
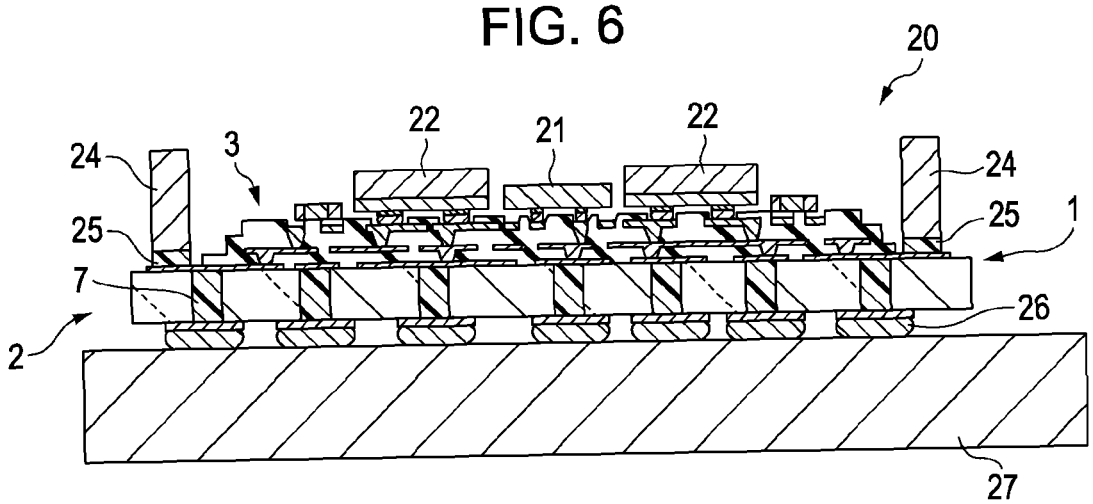
FIG. 6 is a sectional view illustrating an example of how the semiconductor module according to the embodiment of the present invention is mounted.

As shown in FIG. 5, the semiconductor chip 21, the semiconductor packages 22, and the chip components 23 are mounted on the mount board 1 that has been obtained by the method described above. As shown in FIG. 4, the cooling fins 24 are attached to the portions 5a of the inner wiring layer 5, which are exposed to the outside, using the adhesive layers 25. Thus, the semiconductor module 20 is obtained. As shown in FIG. 6, for example, the semiconductor module 20 is mounted on a motherboard 27 using bumps 26 (for example, solder bumps) formed as external connection terminals on the lower surface of the core board 2.

In the embodiment, the mount board 1 is configured such that the portion 5a of the wiring layer 5 is exposed to the outside, wherein the wiring layer 5 is one of the inner layers of the laminated wiring section 3 excluding the uppermost wiring layer. Thus, a cooling structure such as the cooling fin 24 can be mounted on the mount board 1 using the portion 5a of the wiring layer 5. Therefore, the thermal resistance of a heat transfer path extending through the wiring layers can be reduced without limiting the area for mounting electronic components. As a result, regarding mounting of the electronic components, a demand for high density and a demand for low thermal resistance can be simultaneously satisfied.

Moreover, since the laminated wiring section 3 is formed as independent islands on the core board 2, physical connection of the laminated wiring section 3 between adjacent mount boards is broken when the core board 2 having a large size is cut into individual pieces of the mount board 1. Thus, warping of the large-sized core board due to heat shrinkage the insulating layers 14 of the laminated wiring section 3 of can be reduced.

By using the wiring layer 5, which has a portion exposed to the outside, for ground, the following advantage can be gained. That is, the wiring layer for ground is provided with the largest area among the wiring layers. Therefore, by exposing the portion of the wiring layer for ground to the outside, for example, so as to mount a cooling structure thereon as described above, heat can be efficiently transferred to the cooling structure.

Since the edge portions of the insulating layers 14 disposed between the wiring layers are formed in a stepped shape, not only the edge portion of the lowermost wiring layer but also an edge portion of any of the inner wiring layers excluding the uppermost layer can be extended outside the insulating layers and can be exposed to the outside.

The wiring layers of the mount board 1 are laminated asymmetrically (the number of layers are asymmetrical) in the vertical direction. Thus, on the upper surface of the mount board 1, a necessary number of wiring layers can be formed in accordance with the number and the arrangement of terminals of the semiconductor devices (such as the semiconductor chip 21 and the semiconductor package 22) mounted thereon. On the lower surface of the mount board 1, a necessary number of wiring layers can be formed in accordance the number and the arrangement of terminals used for mounting the mount board 1 on the motherboard 27. Thus, as compared with the case when wiring layers are symmetrically formed on the mount board in the vertical direction, the number of layers on a side (lower side) on which the mount board is mounted on the motherboard can be reduced, whereby the number of steps for wiring can be reduced and hence the cost of the mount board can be reduced.

The semiconductor module 20 is configured such that semiconductor devices such as the semiconductor chip 21 and the semiconductor package 22 are mounted on the mount board 1. Moreover, the cooling fins 24 are mounted on the mount board 1 and thermally connected to the portions 5a of the wiring layer 5. Thus, heat generated by the semiconductor devices (such as the semiconductor chip 21 and the semiconductor package 22) can be efficiently transferred to the cooling fins 24 through the inner wiring layer 5.

FIRST MODIFICATION

Figure 7:
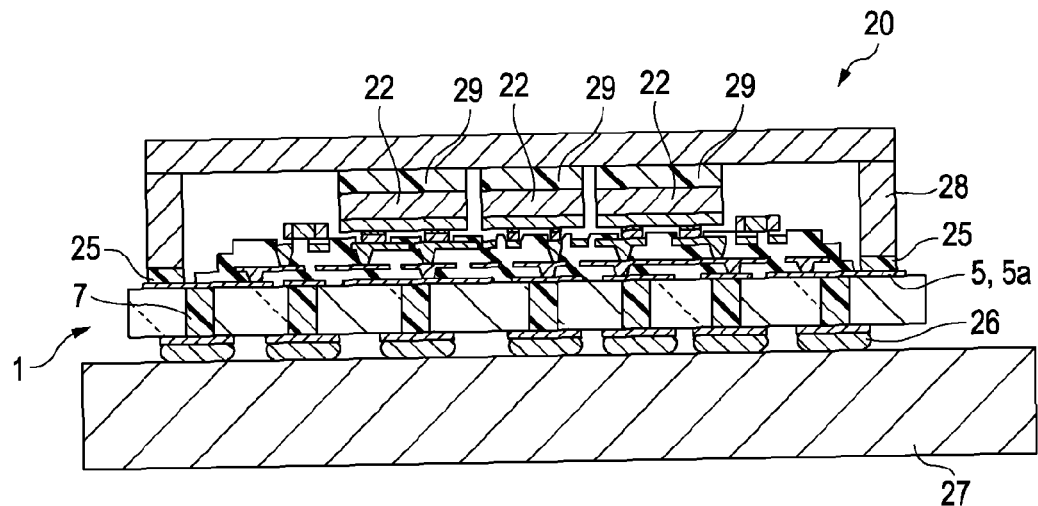
FIG. 7 is a sectional view of a mount board and a semiconductor module according to a first modification of the embodiments of the present invention.

FIG. 7 is a sectional view of a mount board and a semiconductor module according to a first modification of the embodiments of the present invention. As shown in FIG. 7, in the semiconductor module 20, the portion 5a of the lowermost wiring layer 5 is exposed to the outside, and a cooling structure 28 is mounted on the mount board 1 using the exposed portion. The cooling structure 28 has a gate-like shape. Three semiconductor packages 22 are mounted on the mount board 1. The package surface of each of the semiconductor packages 22 is bonded to the cooling structure 28 with an adhesive layer 29 of thermally conductive resin therebetween.

This structure of the semiconductor module 20 allows heat generated by each of the semiconductor packages 22 to be transferred through the adhesive layer 29 as well as through the wiring layer 5. Therefore, as compared with the case when heat generated by the semiconductor packages 22 is transferred only through the wiring layer 5, the heat can be efficiently transferred to the cooling structure 28.

SECOND MODIFICATION

Figure 8:
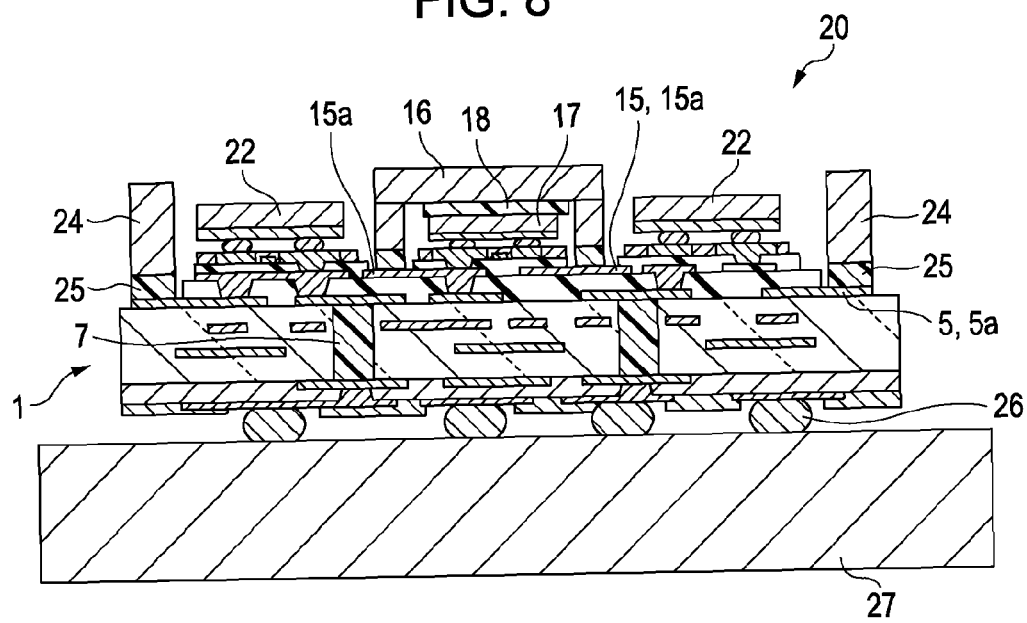
FIG. 8 is a sectional view of a mount board and a semiconductor module according to a second modification of the embodiments of the present invention.

FIG. 8 is a sectional view of a mount board and a semiconductor module according to a second modification of the embodiments of the present invention. As shown in FIG. 8, in the semiconductor module 20, the portion 5a of the lowermost wiring layer 5 is exposed to the outside, and the cooling fins 24 are mounted on the mount board 1 using the exposed portion. Moreover, a portion 15a of the wiring layer 15 right below the uppermost layer is exposed to the outside, and a cooling structure 16 having a gate-like shape is mounted on the mount board 1 using the exposed portion. The cooling structure 16 surrounds a semiconductor package 17 that is disposed between two semiconductor packages 22. The package surface of the semiconductor package 17 is bonded to the cooling structure 16 with a resin layer 18 of thermally conductive resin therebetween. Thus, the cooling structure 16 is thermally connected to the semiconductor package 17.

This structure of the semiconductor module 20 allows heat generated by the semiconductor package 17 to be efficiently transferred to the cooling structure 16 when, for example, a semiconductor chip sealed in the semiconductor package 17 generates a large amount of heat. Moreover, the effect of heat generated by the semiconductor package 17 on adjacent semiconductor packages 22 can be reduced.

The present application contains subject matter related to that disclosed in Japanese Priority Patent Application JP 2008-295195 filed in the Japan Patent Office on Nov. 19, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor module comprising:
    a mount board including a laminated wiring section that includes a plurality of wiring layers formed on a surface of a substrate in a laminated manner, the plurality of wiring layers including an uppermost wiring layer and a plurality of inner wiring layers, each inner wiring layer being any one of the plurality of wiring layers excluding the uppermost wiring layer, and the plurality of inner wiring layers comprising at least a first inner wiring layer and a second inner wiring layer that is distinct from the first inner wiring layer;
    a first semiconductor device, a second semiconductor device, and a third semiconductor device that are each mounted on the mount board and electrically connected to the uppermost wiring layer; and
    a plurality of cooling structures that are each mounted on the mount board,
    wherein,
        the first semiconductor device is disposed between the second and third semiconductor devices,
        the first inner wiring layer is a wiring layer right below the uppermost wiring layer,
        portions of the first inner wiring layer on respective sides of the first semiconductor device are each exposed to the outside, and a cooling structure having a gate-like shape and surrounding the first semiconductor device is thermally connected to the portions of the first inner wiring layer, and
    edge portions of the second inner wiring layer, with one edge portion being on a side of the second semiconductor device and one edge portion being on a side of the third semiconductor device, are each exposed to the outside, and respective cooling structures are thermally connected to the edge portions of the second inner wiring layer.

2. The semiconductor module according to claim 1, wherein edge portions of insulating layers disposed among the plurality of wiring layers are formed in a stepped shape.

3. The semiconductor module according to claim 1, wherein the second inner wiring layer is a wiring layer used for ground.

4. The semiconductor module according to claim 1, wherein each of the respective cooling structures thermally connected to the edge portions of the second inner wiring layer is a cooling fin.

5. The semiconductor module according to claim 4, wherein the cooling fin is made of copper and has surfaces plated with nickel.

6. The semiconductor module according to claim 1, wherein the first semiconductor device has a surface that is bonded, with a thermal adhesive layer, to the cooling structure thermally connected to the portions of the first inner wiring layer.

7. The semiconductor module according to claim 1, wherein each of the first, second, and third semiconductor devices is a semiconductor package having a semiconductor chip enclosed therein.

\* \* \* \* \*